(12) United States Patent
Wu et al.

(10) Patent No.: US 6,698,007 B2
(45) Date of Patent: Feb. 24, 2004

(54) METHOD AND APPARATUS FOR RESOLVING COLORING CONFLICTS BETWEEN PHASE SHIFTERS

(75) Inventors: Shao-Po Wu, Portola Valley, CA (US); Seonghun Cho, Santa Clara, CA (US); Alexandre Arkhipov, San Jose, CA (US); Ilya Grishashvili, San Jose, CA (US)

(73) Assignee: Numerical Technologies, Inc., San Jose, CA (US)

( * ) Notice: Subject to any disclaimer, the term of this patent is extended or adjusted under 35 U.S.C. 154(b) by 232 days.

(21) Appl. No.: 09/975,414

(22) Filed: Oct. 9, 2001

(65) Prior Publication Data

US 2003/0070155 A1 Apr. 10, 2003

(51) Int. Cl.⁷ .......................... G06F 17/50; G03C 5/00
(52) U.S. Cl. ........................... 716/19; 716/21; 430/5
(58) Field of Search ..................... 716/19, 20, 21; 430/5, 30

(56) References Cited

U.S. PATENT DOCUMENTS

| 4,037,918 A | 7/1977 | Kato ........................ 350/3.5 |
| 4,456,371 A | 6/1984 | Lin ........................... 355/71 |
| 5,302,477 A | 4/1994 | Dao et al. ...................... 430/5 |

(List continued on next page.)

FOREIGN PATENT DOCUMENTS

DE  195 45 163 A1  6/1996
EP  0 464 492 A1  1/1992
EP  0 653 679 A2  5/1995

(List continued on next page.)

OTHER PUBLICATIONS

Wang, R., et al., "Plarized Phase Shift Mask: Concept, Design, and Potential Advantages to Photolithography Process and Physical Design", Motorola Semiconductor Product Sector (12 pages). no date.

Ogawa, K., et al., "Phase Defect Inspection by Differential Interference", Lasertec Corporation (12 pages). no date.

Pistor, T., "Rigorous 3D Simulation of Phase Defects in Alternating Phase–Shifting Masks", Panoramic Technology Inc. (13 pages). no date.

(List continued on next page.)

*Primary Examiner*—Leigh M. Garbowski

(57) ABSTRACT

One embodiment of the invention provides a system that automatically resolves conflicts between phase shifters during creation of a phase shifting mask to be used in an optical lithography process for manufacturing an integrated circuit. Upon receiving a specification of a layout on the integrated circuit, the system identifies critical-dimension features within the layout. Next, the system places phase shifters comprised of phase shifting geometries on the phase shifting mask to precisely define the critical-dimension features. In doing so, the system identifies junctions within and/or between the critical-dimension features, and removes phase shifting geometries associated with the junctions to obviate coloring conflicts between phase shifters on the phase shifting mask. In one embodiment of the invention, the junctions include T-junctions and/or L-junctions.

39 Claims, 11 Drawing Sheets

U.S. PATENT DOCUMENTS

| | | | |
|---|---|---|---|
| 5,308,741 A | 5/1994 | Kemp | 430/312 |
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,472,814 A | 12/1995 | Lin | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,827,623 A | 10/1998 | Ishida et al. | 430/5 |
| 5,858,580 A | 1/1999 | Wang et al. | 430/5 |
| 5,885,734 A | 3/1999 | Pierrat et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,010,807 A | 1/2000 | Lin | 430/5 |
| 6,057,063 A | 5/2000 | Liebmann et al. | 430/5 |
| 6,066,180 A | 5/2000 | Kim et al. | 716/19 |
| 6,077,630 A | 6/2000 | Pierrat | 430/5 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0122994 A1 | 9/2002 | Cote et al. | 430/5 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| EP | 0 698 821 | 2/1996 |
| GB | 2333613 A | 7/1999 |
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |
| WO | WO 02/073312 | 9/2002 |

OTHER PUBLICATIONS

Semmier, A., et al., "Application of 3D EMF Simulation for Development and Optimization of Alternating Phase Shifting Masks", Infineon Technologies AG (12 pages). no date.

Wong, A., et al., "Polarization Effects in Mask Transmission", University of California Berkeley (8 pages). no date.

Hirai, Y., et al., "Automatic Pattern Generation System for Phase Shifting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Kikuchi, K., et al., "Method of Expanding Process Window for the Double Exposure Technique with alt–PSMs", Optical Microlithography XIII, Proceeding of SPIE, vol. 4000, pp. 121–131 (2000).

Liebmann, L.W., et al., "TCAD Development For Lithography Resolution Enhancement", IBM J. Res. & Dev., vol. 45, No. 5, pp. 651–665, Sep. 5, 2001.

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Full–Chip CD Simulation", SPIE, vol. 4182, pp. 335–341 (2000).

Plat, M., et al., "The Impact of Optical Enhancement Techniques on the Mask Error Enhancement Funchtion (MEED)", SPIE, vol. 4000, pp. 206–214, Mar. 1–3, 2000.

Mansuripur, M., et al., "Projection Photolithography", Optics & Photonics News 11, 17 pages. Feb. 2000.

Ackmann, P. et al., "Phase Shifting And Optical Proximity Corrections To Improve CD Control On Logic Devices In Manufacturing For Sub 0.35 $\mu$m I–Line", Advance Micro Devices (8 pages). no date.

Matsuoka, K. et al., "Application Of Alternating Phase–Shifting Mask To 0.16 $\mu$m CMOS Logic Gate Patterns", Matsushita Electric Ind. Co., Ltd. (9 pages). no date.

Spence, C. et al., "Detection Of 60° Phase Defects On Alternating PSMs", Advance Micro Devices, KLA–Tencor, DuPont RTC (2 pages). no date.

Schmidt, R., et al., "Impact of Coma on CD Control for Multiphase PSM Designs", AMD, ASML (11 pages). no date.

Erdmann, A., "Topography Effects and Wave Aberrations in Advance PSM–Technology", Fraunhofer Institute of Integrated Circuits (11 pages). no date.

Granik, Y., et al., "CD Variation Analysis Technique and its Application to the Study of PSM Mask Misalignment", Mentor Graphics (9 pages). no date.

Hanyu, et al., "New Phase–Shifting Mask with Highly Transparent SiO2 Phase Shifters", Fujitsu Laboratories Ltd. (11 pages). no date.

Ishiwata, N., et al., "Fabrication of Phase–Shifting Mask", Fujitsu Limited (11 pages). no date.

Levenson, M., et al., "Phase Phirst! An Improved Strong–PSM Paradigm", M.D. Levenson Consulting, Petersen Advanced Lithography, KLA–Tencor (10 pages). no date.

Levenson, M., et al., "SCAA Mask Exposures and Phase Phirst Design for 110nm and Below", M.D. Levenson Consulting, Canon USA, Inc., JSR Microelectronics, Inc. (10 pages). no date.

Lin, B.J., "The Relative Importance of the Bulding Blocks for 193nm Optical Lithography", Linnovation, Inc. (12 pages). no date.

McCallum, M., et al., "Alternating PSM Mask Performance—a Study of Multiple Fabrication Tecnique Results", International SEMATECH (6 pages). no date.

Morikawa, Y., et al., "100nm–alt.PSM Structure Discussion for ArF Lithography", Dai–Nippon Printing Co., Ltd. (15 pages). no date.

Ozaki, T., et al., "A 0.15um KrF Lithography for 1Gb DRAM Product Using Highly Printable Patterns and Thin Resist Process", Toshiba Corporation (2 pages). no date.

Rhyins, P., et al., "Characterization of Quartz Etched PSM Masks for KrF Lithography at the 100nm Node", Photronics, Inc., MIT Lincoln Lab, Arch Chemicals, Finle Technologies, KLA Tencor Corp. (10 pages). no date.

Ronse, K., et al., "Thin Interference Effects in Phase Shifting Masks Causing Phase and Transmittance Errors", IMEC (15 pages). no date.

Rosenbluth, A., et al., "Optimum Mask and Source Patterns to Print a Given Shape", IBM (17 pages). no date.

Sakata, M., et al., "A Novel Radiation Sensitive Spin–on–Glass Convertible into SiO2 and the Simple Fabrication Process Using It", Oki Electric Industry Co. Ltd. (3 pages).

Schmidt, R., et al., "Impact of Coma on CD Control for Multiphase PSM Designs", AMD, ASML (10 pages). no date.

Sewell, H., et al., "An Evaluation of the Dual Exposure Technique", SVG Lithography Systems Inc. (11 pages). no date.

Spence, C., et al., "Optimization of Phase–Shift Mask Designs Including Defocus Effects", AMD, Princeton University, Vecor Technologies Inc. (8 pages). no date.

Suzuki, A., et al., "Multilevel Imaging System Realizing k1=–.3 Lithography", Canon Inc. (13 pages). no date.

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages). no date.

Fukuda, H., et al., "Patterning of Random Interconnect Using Double Exposure of Strong–Type PSMs", Hitachi Central Research Lab (8 pages). no date.

Ferguson, R., et al., "Pattern–Dependent Correction of Mask Topography Effects for Alternating Phase–Shifting Masks", IBM Microelectronics, University of California Berkeley (12 pages). no date.

Toublan, O., et al., "Phase and Transmission Errors Aware OPC Solution for PSM: Feasibility Demonstration", Mentor Graphics Corp. (7 pages). no date.

Yanagishita, Y., et al., "Phase–Shifting Photolithography Applicable to Real IC Patterns", Fujitsu Limited (11 pages). no date.

Levenson, M., et al., "Improving Resolution in Photolithography with a Phase–Shifting Mask", IEEE, Transaction On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Terasawa, T. et al., "0.3–Micron Optical Lithography Using A Phase–Shifting Mask", SPIE, Optical/Laser Microlithography II, vol. 1088, pp. 25–33, Mar. 1989.

Buraschi, M., et al., "Optical–Difraction–Based Modulation of Photoresist Profile or Microlithography Applications", Optical Engineering, vol. 28, No. 6, pp. 654–658, Jun. 1989.

Nitayama A., et al., "New Phase Shifting Mask with Self–Aligned Phase Sifters for a Quarter Micron Photolithography", IEDM, pp. 3.3.1–3.3.4, Dec. 3–6, 1989.

Jinbo, H. et al., "0.2 $\mu$m Or Less i–Line Lithography By Phase–Shifting–Mask Technology", IEEE, pp. 33.3.1–33.3.4 (1990).

Neureuther, A., "Modeling Phase Shifting Masks", SPIE, 10$^{th}$ Annual Symposium on Microlithography, vol. 1496, pp. 80–85 (1990).

Toh, K., et al., "Chromeless Phase–Shifted Masks: A New Approach to Phase–Shifting Masks", BACUS—Tenth Annual Symposium on Microlithograpy, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Inokuchi, K. et al., "Sub–Quarter Micron Gate Fabrication Process Using Phase–Shifting–Mask For Microwave GaAs Devices", Extended Abstracts of the 1991 Intl. Conference on Solid State Devices and Materials, Yokohama, Japan, pp. 92–94 (1991).

Inokuchi, K. et al., "Sub–Quarter–Micron Gate Fabrication Process Using Phase–Shifting Mask For Microwave GaAs Devices", Japanese Journal of Applied Physics, vol. 30, No. 12B, pp. 3818–3821, Dec. 1991.

Jinbo, H. et al., "Improvement Of Phase–Shifter Edge Line Mask Method", Japanese Journal of Applied Physics, vol. 30, No. 11B, pp. 2998–3003, Nov. 1991.

Kimura, T. et al., "Subhalf–Micron Gate GaAs Mesfet Process Using Phase–Shifting–Mask Technology", IEEE, GaAs IC Symposium, pp. 281–284 (1991).

Wiley, J. et al., "Phase Shift Mask Pattern Accuracy Requirements And Inspection Technology", SPIE, Integrated Circuit Metrology, Inspection, and Process Control V, vol. 1464, pp. 346–355 (1991).

Burggraff, P., "Four More Significant Japanese Advances in Phase Shifiting Technology", Semiconductor International, p. 16, 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Asai, S. et al., "High Performance Optical Lithography Using A Separated Light Source", J. Vac. Sci. Technol. B, vol. 10, No. 6, pp. 3023–3026, Nov./Dec. 1992.

Jinbo, H. et al., "Application Of Blind Method To Phase–Shifting Lithography", IEEE, 1992, Symposium on VLSI Technology Digest of Technical Papers, pp. 112–113 (1992).

Ohtsuka, H. et al., "Phase Defect Repair Method For Alternating Phase Shift Masks Conjugate Twin–Shifter Method", Jpn. J. Appl. Phys., vol. 31, pp. 4143–4149 (1992).

Pierrat, C. et al., "Phase–Shifting Mask Topography Effects On Lithographic Image Quality", IEEE, pp. 3.3.1–3.3.4 (1992).

Watanabe, H. et al., "Detection And Printability Of Shifter Defects In Phase–Shifting Masks II Defocus Characteristics", Jpn. J. Appl. Phys., vol. 31, pp. 4155–4160 (1992).

Burggraaf, P., "Lithography's Leading Edge, Part 1: Phase–Shift Technology and Part 2: I–Line and Beyond", Semiconductor International, pp. 43–47 and 52–56, Feb. 1992.

Hosono, K., et "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, Vo. 1927, pp. 182–189 (1993).

Brunner, T., "Rim Phase–Shift Mask Combined with Off–Axis Illumination: A Path to 0.5(lampda)/Numerical Aperture Geometries", Optical Engineering, vol. 32, No. 10, pp. 2337–2343, Oct. 1993.

Lin, B.J., "Phase–Shifting Masks Gain An Edge", IEEE Circuits & Devices, pp. 28–35, Mar. 1993.

Liu, H.Y. et al., "Fabrication of 0.1 um T–Shaped Gates By Phase–Shifting Optical Lithography", SPIE, Optical/Laser Microlithography VI, vol. 1927, pp. 42–52 (1993).

Nistler, J. et al., "Phase Shift Mask Defect Printability Analysis", Proceedings of the Microlithography Seminar Interface '93, OCG Microelectronic Materials, Inc., pp. 11–28 (1993).

Rieger, M. et al., "System For Lithography Proximity Compensation", Precim Company, Portland, Oregon, Sep. 1993 (28 pages).

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Maskmaking and its Application", J. Vac. Sci. Technol. B, vol. 11, No. 6, pp. 2669–2674, Nov./Dec. 1993.

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno F., et al., "Practical Phase–Shifting Mask Technology for 0.3um Large Scale Integration", J. Vac. Sci. Technol. B, vol. 12, No. 6, pp. 3799–3803, Nov./Dec. 1994.

Nistler, J. et al., "Large Area Optical Design Rule Checker For Logic PSM Application", SPIE, Photomask and X–Ray Mask Technology, vol. 2254, pp. 78–92 (1994).

Pati, Y.C. et al., "Phase–Shifting Masks For Microlithography: Automated Design And Mask Requirements", J. Opt. Soc. Am., vol. 11, No. 9, pp. 2438–2452, Sep. 1994.

Pierrat, C. et al., "A Rule–Based Approach To E–Beam And Process–Induced Proximity Effect Correction For Phase–Shifting Mask Fabrication", SPIE, vol. 2194, pp. 298–309 (1994).

Spence, C. et al., "Automated Determination Of CAD Layout Failures Through Focus: Experiment And Simulation", SPIE, vol. 2197, pp. 302–313 (1994).

Stirniman, J. et al., "Wafer Proximity Correction And Its Impact On Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E. et al., "OPTIMASK: An OPC Algorithm For Chrome And Phase–Shift Mask Design", SPIE, vol. 2440, pp. 192–206, Feb. 1995.

Karklin, L., "A Comprehensive Simulation Study Of The Photomask Defects Printability", SPIE, vol. 2621, pp. 490–504 (1995).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishiwata, N. et al., "Novel Alternating Phase Shift Mask With Improved Phase Accuracy", SPIE, Proceedings of the 17$^{th}$ Annual Symposium on Photomask Technology and Management, vol. 3236, pp. 243–249 (1997).

Morimoto, H. et al., "Next Generation Mask Strategy—Technologies Are Ready For Mass Production Of 256MDRAM?", SPIE, vol. 3236, pp. 188–189 (1997).

Roman, B. et al., "Implications Of Device Processing On Photomask CD Requirements", SPIE, vol. 3236 (1997) (Abstract Only).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (Prophet) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages). no date.

Petersen, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Fukuda, H. et al., "Determination Of High–Order Lens Aberration Using Phase/Amplitude Linear Algebra", J. Vac. Sci. Technol. B, vol. 17, No. 6, pp. 3318–3321, Nov./Dec. 1999.

Fukuda, H., "Node–Connection/Quantum Phase–Shifting Mask: Path To Below 0.3 $\mu$m Pitch, Proximity Effect Free, Random Interconnects And Memory Patterning", J. Vac. Sci. Technol. B, vol. 17, No. 6, pp. 3291–3295, Nov./Dec. 1999.

Spence, C. et al., "Integration Of Optical Proximity Correction Strategies In Strong Phase Shifters Design For Poly–Gate Layers", Bacus News, vol. 15, Issue 12, pp. 1, 4–13, Dec. 1999.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts pp. 18–19, May30–Jun. 2,2000.

Pierrat, C., "Investigation of Proximity Effects in Alternating Aperture Phase Shifting Masks", Numerical Technologies, Inc. (11 pages). no date.

Cote, M., et al., "A Practical Application of Full–Feature Alternating Phase–Shifting Technology for a Phase–Aware Standard–Cell Design Flow", Numerical Technologies Inc. (6 pages). no date.

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

METHOD AND APPARATUS FOR RESOLVING COLORING CONFLICTS BETWEEN PHASE SHIFTERS

BACKGROUND

1. Field of the Invention

The invention relates to the process of designing and fabricating semiconductor chips. More specifically, the invention relates to a method and an apparatus for automatically resolving conflicts between phase shifters during creation of a mask to be used in an optical lithography process for manufacturing an integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process generally begins with the formation of a photoresist layer on the surface of a semiconductor wafer. A mask composed of opaque regions, which are generally formed of chrome, and light-transmissive clear regions, which are generally formed of quartz, is then positioned over this photo resist layer coated wafer. (Note that the term "mask" as used in this specification is meant to include the term "reticle.") Light is then shone on the mask from a visible light source or an ultraviolet light source.

This light is generally reduced and focused through an optical system that contains a number of lenses, filters and mirrors. The light passes through the clear regions of the mask and exposes the underlying photoresist layer. At the same time, the light is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

Phase shifters are often incorporated into a mask in order to achieve line widths that are smaller than the wavelength of the light that is used to expose the photoresist layer through the mask. During phase shifting, destructive interference caused by two adjacent clear areas on a mask is used to create an unexposed area on the photoresist layer. This is accomplished by exploiting the fact that light passing through a mask's clear regions exhibits a wave characteristic having a phase that is a function of the distance the light travels through the mask material. By placing two clear areas adjacent to each other on the mask, one of thickness $t_1$ and the other of thickness $t_2$, one can obtain a desired unexposed area on the underlying photoresist layer caused by interference. By varying the thickness $t_1$ and $t_2$ appropriately, the light exiting the material of thickness $t_2$ is 180 degrees out of phase with the light exiting the material of thickness $t_1$. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999.

For example, FIG. 1 illustrates how a phase shifter comprised of a zero-degree clear region 104 and a 180-degree clear region 106 is used to achieve a smaller line width for a gate region of a transistor. As circuit dimensions on semiconductor chips become progressively smaller, phase shifters are presently being used to define other critical-dimension features in addition to transistor gates. FIG. 2 illustrates how phase shifters are additionally used to define interconnections between phase shifters. For example, in FIG. 2 phase shifters 210–213 are used to define the gates of four different transistors 202–205 in the circuit layout. However, phase shifters 210–212 additionally extend past these gate regions to additionally define interconnections between the gates. Note that in FIG. 2, phase shifters are represented by diagonal lines, non-phase-shifted features are represented by cross-hatching, phase-shifted regions are clear and diffusion regions are represented by a grid pattern.

As phase shifters are used define more features on a semiconductor chip, coloring conflicts are more likely to arise between phase shifters. Note that phase shifters operate by creating interference patterns between zero-degree clear regions and 180-degree clear regions. Coloring conflicts arise when nearby phase shifting regions have the same phase. For example, when a first zero-degree clear region is in close proximity to a second zero-degree clear region, light from the first clear region reinforces light from the second clear region on the photoresist layer between the first and second clear regions. This can cause unwanted exposure of the photoresist layer.

In order to prevent this problem, systems that lay out phase shifters typically perform tests to ensure that coloring conflicts to not occur. However, as more phase shifting regions are incorporated into a phase shifting mask, it becomes increasingly harder to assign phases to phase shifters so that coloring conflicts do not occur.

A particular problem arises in defining phase shifters to form junctions, such as T-junctions and L-junctions and assigning phase to the same. For example, consider the T-junction 401 illustrated in FIG. 4A. Three phase shifters are used to define this T-junction, including zero-degree region 402, 180-degree region 403 and zero-degree region 404. Note that a coloring violation arises between zero-degree region 402 and zero-degree region 404 on the left-hand side of the T-junction. Furthermore, note that any possible assignment of phases to phase shifters 402–404 also causes a coloring violation.

What is needed is a method and an apparatus for resolving coloring conflicts that arise between phase shifters that arise at T-junctions and/or L-junctions.

SUMMARY

One embodiment of the invention provides a system that automatically resolves conflicts between phase shifters during creation of a phase shifting mask to be used in an optical lithography process for manufacturing an integrated circuit. Upon receiving a specification of a layout on the integrated circuit, the system identifies critical-dimension features within the layout. Next, the system places phase shifters comprised of phase shifting geometries on the phase shifting mask to precisely define the critical-dimension features. In doing so, the system identifies junctions within and/or between the critical-dimension features, and removes phase shifting geometries associated with the junctions to obviate coloring conflicts between phase shifters on the phase shifting mask.

In one embodiment of the invention, the junctions include T-junctions and/or L-junctions.

In one embodiment of the invention, the system assigns merit values between phase shifting geometries that potentially conflict. The system subsequently uses these merit values in deciding which phase shifting geometries to remove. In a variation on this embodiment, the system assigns merit values using a rule-based mechanism. In a variation on this embodiment, the system assigns merit values using a model-based mechanism.

In one embodiment of the invention, the system removes phase shifting geometries by performing a coloring operation on the phase shifting geometries. Next, if one or more coloring conflicts are detected during the coloring operation, the system removes phase shifting geometries associated with the junctions to obviate the coloring conflicts.

In one embodiment of the invention, the system removes phase shifting geometries associated with junctions that can potentially give rise to coloring conflicts. Next, the system performs a coloring operation on the remaining phase shifting geometries, and then inserts removed phase shifting geometries back into the phase shifting mask, if it is possible to do so without creating a coloring conflict.

In one embodiment of the invention, the system additionally assigns phases to the phase shifting geometries in a manner that avoids conflicts between phase shifters.

In one embodiment of the invention, the critical-dimension features include transistor gates and critical interconnects.

One embodiment of the invention provides an integrated circuit created through a process that resolves conflicts between phase shifters during creation of a phase shifting mask. This integrated circuit includes critical-dimension features created by using phase shifters comprised of phase shifting geometries on a phase shifting mask. In creating these critical-dimension features, phase shifting geometries for T-junctions are removed to obviate coloring conflicts. In a variation in this embodiment, phase shifting geometries for L-junctions are also removed to obviate coloring conflicts.

DETAILED DESCRIPTION

Wafer Fabrication Process

Figure 1:
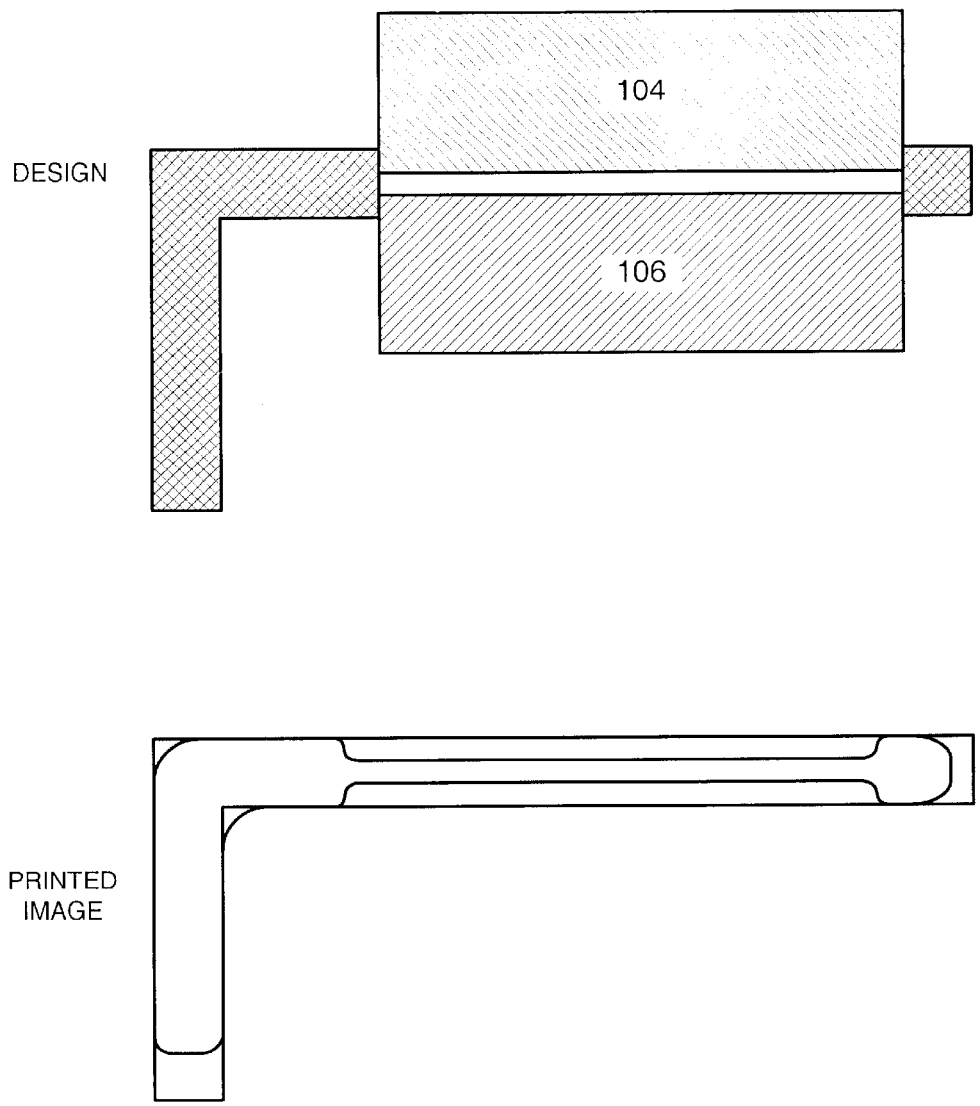
FIG. 1 illustrates the use of a phase shifter to define a transistor gate in accordance with an embodiment of the invention.
Figure 2:
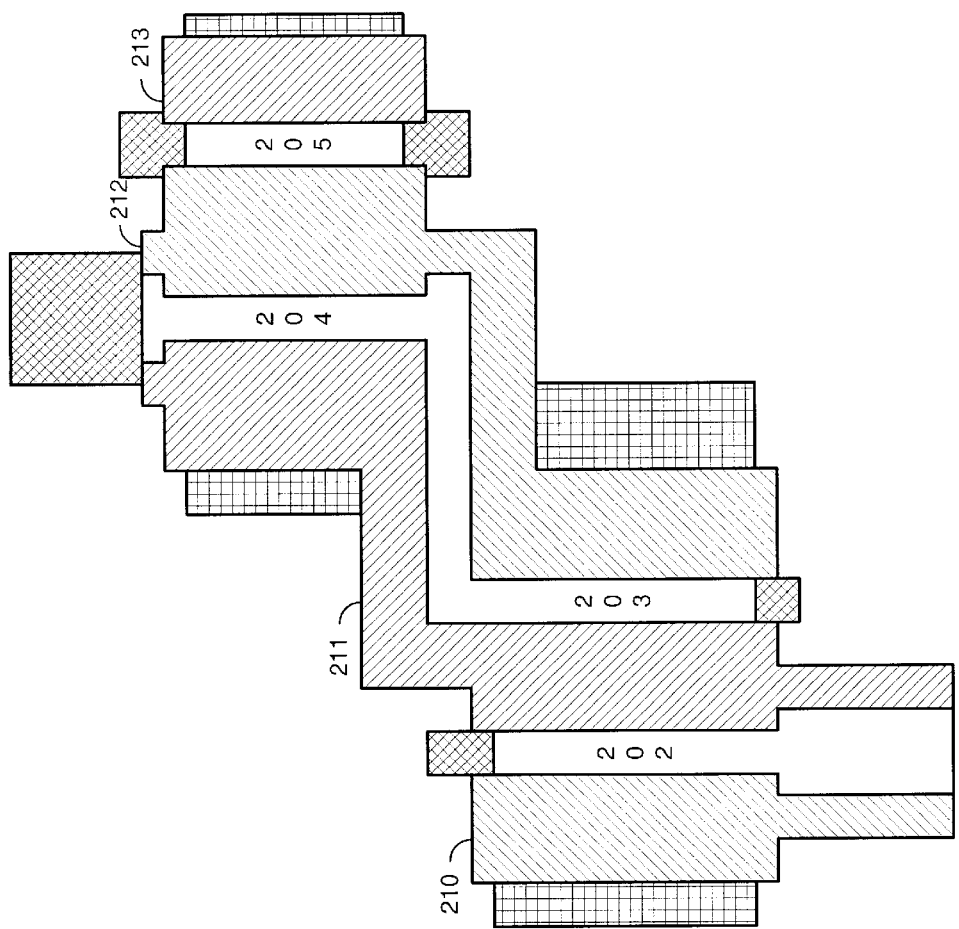
FIG. 2 illustrates the use of phase shifters to define multiple transistor gates in accordance with an embodiment of the invention.
Figure 3:
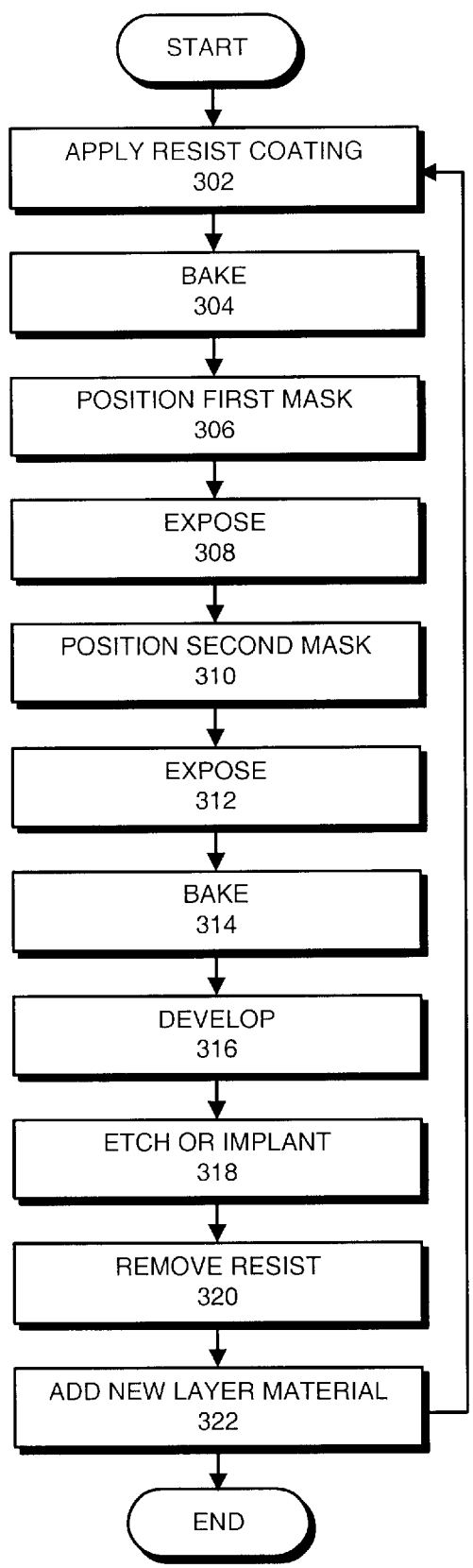
FIG. 3 is a flow chart illustrating the wafer fabrication process in accordance with an embodiment of the invention.

FIG. 3 is a flow chart illustrating the wafer fabrication process in accordance with an embodiment of the invention. The system starts by applying a photoresist layer to the top surface of a wafer (step 302). Next, the system bakes the photoresist layer (step 304). The system then positions the first mask over the photoresist layer (step 306), and then exposes the photoresist layer through the first mask (step 308). Next, the system positions the second mask over the photoresist layer (step 310), and then exposes the photoresist layer through the second mask (step 312). Note that the first mask and/or the second mask can include phase shifting regions.

The system then bakes the wafer again (step 314) before developing the photoresist layer (step 316). Next, either a chemical etching or ion implantation step takes place (step 318) before the photoresist layer is removed (step 320). Finally, a new layer of material can be added and the process can be repeated for the new layer (step 322).

T-Junction

Figure 4A:
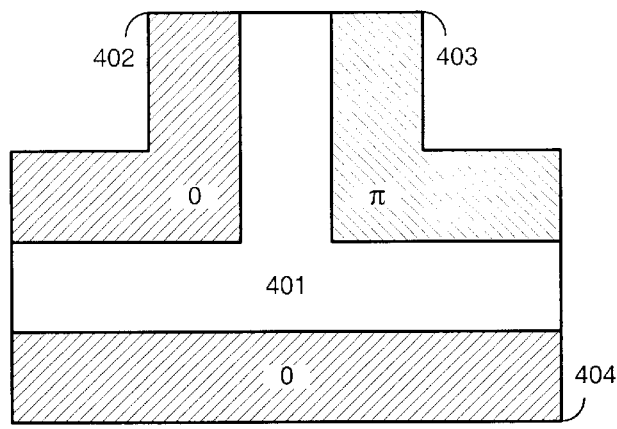
FIG. 4A illustrates a T-junction in accordance with an embodiment of the invention.

As was described above with reference to FIG. 4A, a particular problem arises in producing phase shifters to form junctions, such as T-junctions and L-junctions. In FIG. 4A, three phase shifters are used to define a T-junction. These three phase shifters include zero-degree region 402, 180-degree region 403 and zero-degree region 404. However, note that all possible assignments of phases to the phase shifters 402–404 cause coloring violations.

In order to obviate this problem, T-junction 401 can be removed from consideration while producing phase shifters. Note that the T-junction 401 is not actually removed from the final layout/circuit. It is merely removed from consideration during this stage of the process of defining phase shifters and assigning phase.

Figure 4B:
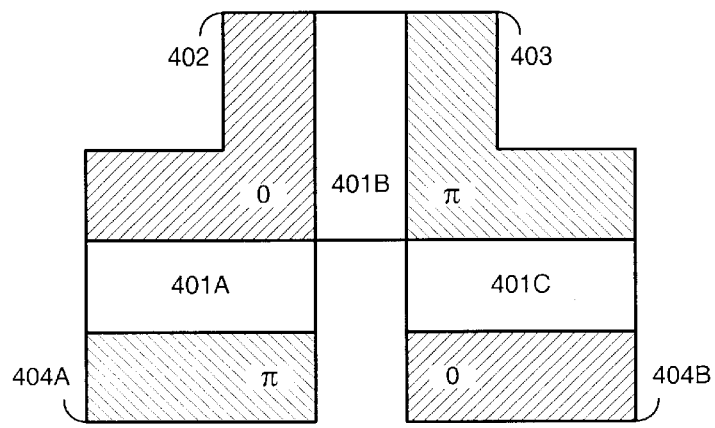
FIG. 4B illustrates how a T-junction is removed to obviate a coloring conflict in accordance with an embodiment of the invention.

By removing T-junction 401, four phase shifting regions 402, 403, 404A and 404B, are created instead of the three in FIG. 4A (see FIG. 4B). Note that the lower phase shifting region 404 from FIG. 4A is effectively divided into two separate regions 404A and 404B in FIG. 4B. Also note that the resulting phase shifting regions 402, 403, 404A and 404B can be colored without conflicts as is illustrated in FIG. 4B.

Figure 4C:
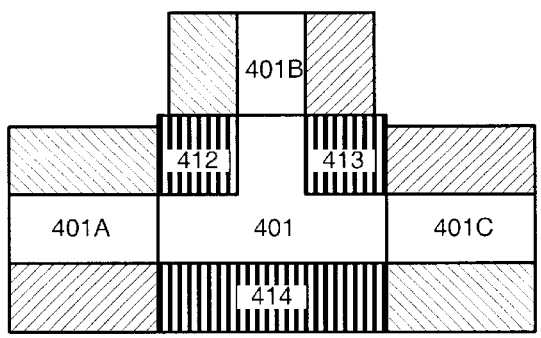
FIG. 4C illustrates how phase shifting geometries surrounding a T-junction are removed in accordance with an embodiment of the invention.
Figure 4D:
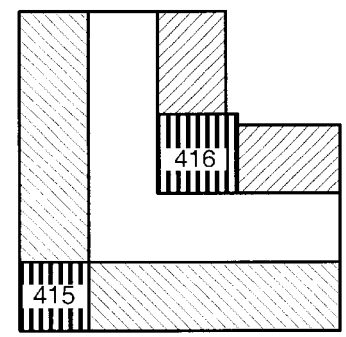
FIG. 4D illustrates how phase shifting geometries surrounding an L-junction are removed in accordance with an embodiment of the invention.
Figure 4E:
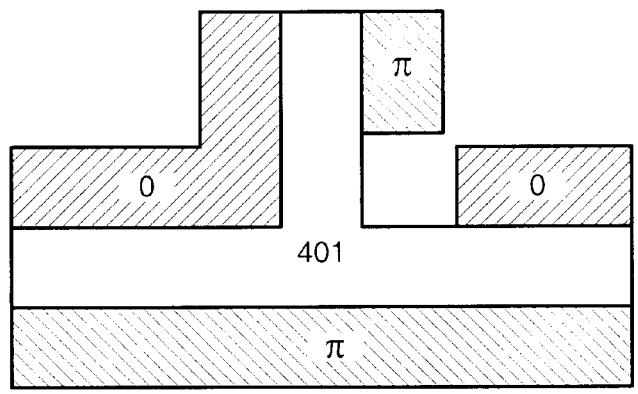
FIG. 4E illustrates how a phase shifting geometry near a T-junction can be removed in accordance with an embodiment of the invention.
Figure 4F:
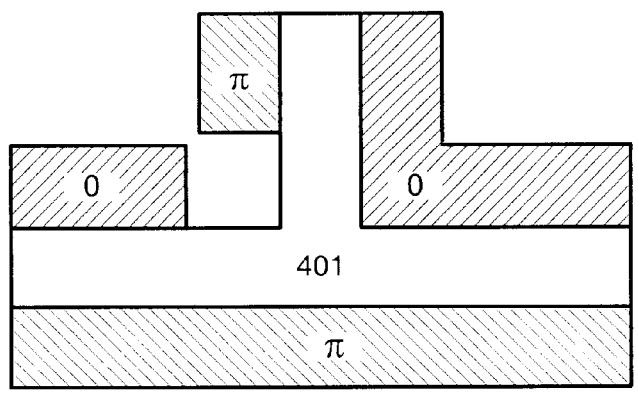
FIG. 4F illustrates how another phase shifting geometry surrounding a T-junction can be removed in accordance with an embodiment of the invention.
Figure 4G:
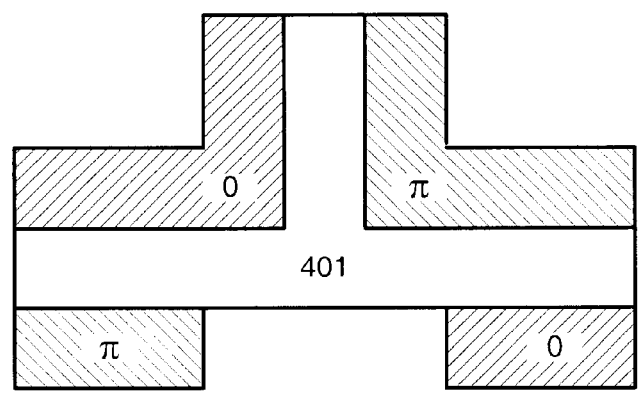
FIG. 4G illustrates how yet another phase shifting geometry near a T-junction can be removed in accordance with an embodiment of the invention.

The removal of phase shifting geometries surrounding a T-junction is illustrated in FIG. 4C. In FIG. 4C, three different phase shifter portions 412–414 can be removed. Similarly, in FIG. 4D, two different phase shifter portions 415–416 can be removed. Also note as seen with portion 412, portion 413, and portion 416, the removed portion should be of adequate size to permit a gap between the remaining shifters. The gap should be of sufficient size to permit resolution of the space between the shifters as determined by the relevant design rules for a particular layout. Thus notice the corners of the remaining shifters adjacent to those portion no longer touch. In some embodiments, the separation is related to the minimum spacing rules for the layout.

Moreover, we can extend the T-junction area 401 to provide multiple ways of T-junction conflict resolution. Consider the "extended" T-junction shown in FIG. 4C, the "401" area is now enlarged such that we have three junction shifter pieces, 412–414, that we can remove or re-insert to properly phase-shift critical features 401A, 401B and 401C. As alternatives to the solution shown in FIG. 4B, FIGS. 4E, 4F and 4G illustrate three other solutions produced by removing 412, 413 and 414 individually. Note that the same extension idea can also be applied to the L-junction illustrated in FIG. 4D.

Phase Shifter Placement and Assignment Flow Architecture

Figure 5:
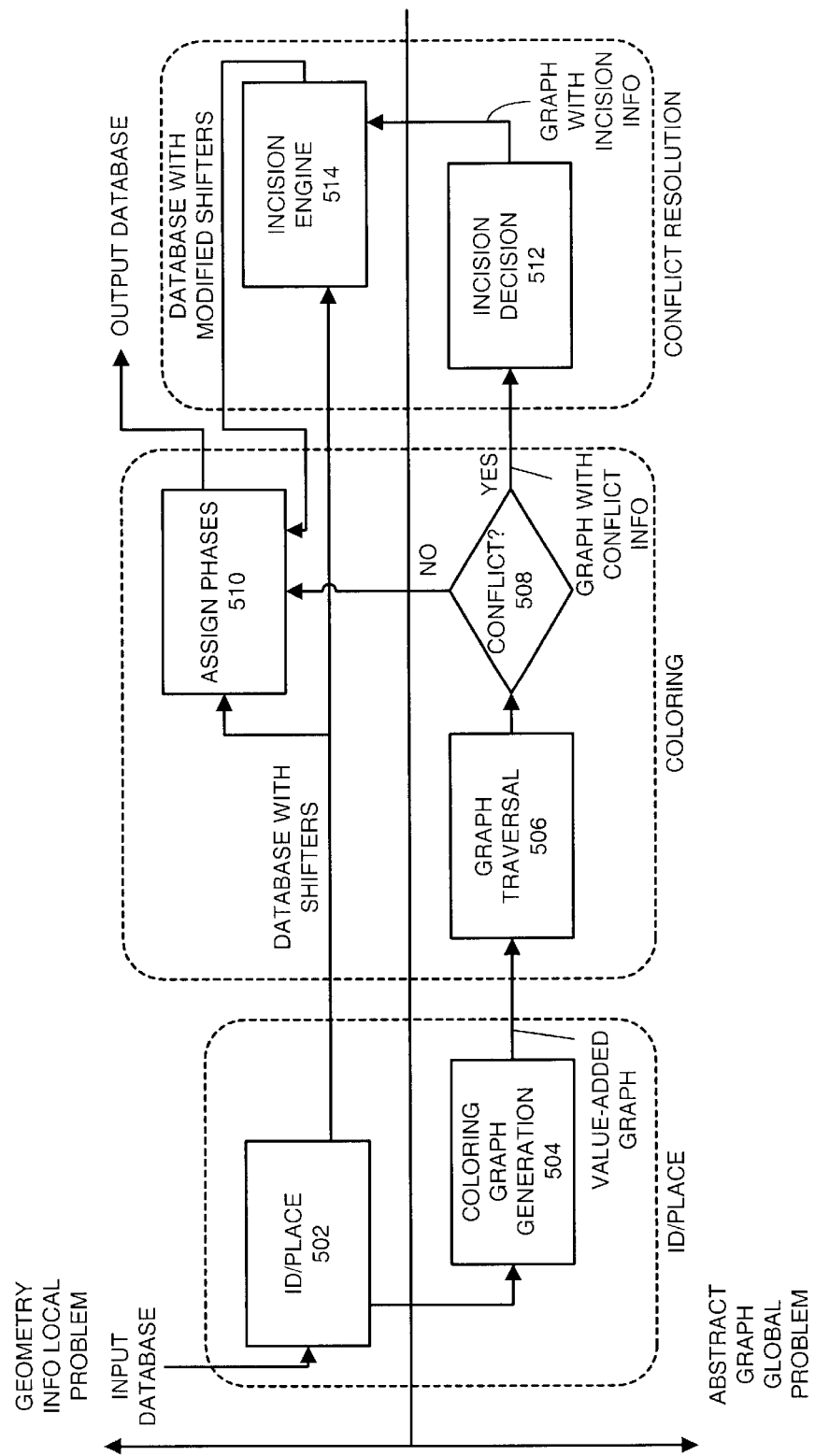
FIG. 5 illustrates a phase shifter placement and assignment flow architecture in accordance with an embodiment of the invention.

FIG. 5 illustrates a phase shifter placement and assignment flow architecture in accordance with an embodiment of the invention. Upon receiving an input layout from a database, the system identifies critical features and places phase shifters of the phase shifting mask to define the critical features (box 502). Next, the system generates a coloring graph based on the placement of the phase shifters (box 504). This coloring graph may include merit values for relationships between phase shifters as is described below with reference to FIG. 8.

The system then performs a coloring operation which involves a graph traversal (box 506). During this process, the system determines if there is a conflict (box 508). If no conflict is detected during this coloring operation, the system assigns phases to the phase shifters (box 510) to produce an output layout that is stored in the database.

If coloring conflicts are detected, the system decides where to make incisions in phase shifters in order to obviate the coloring conflicts (box 512). Next, the system uses an incision engine to actually make the incisions (box 514). The system then assigns phases to the phase shifters (box 510) to produce an output layout that is stored in the database.

Figure 6:
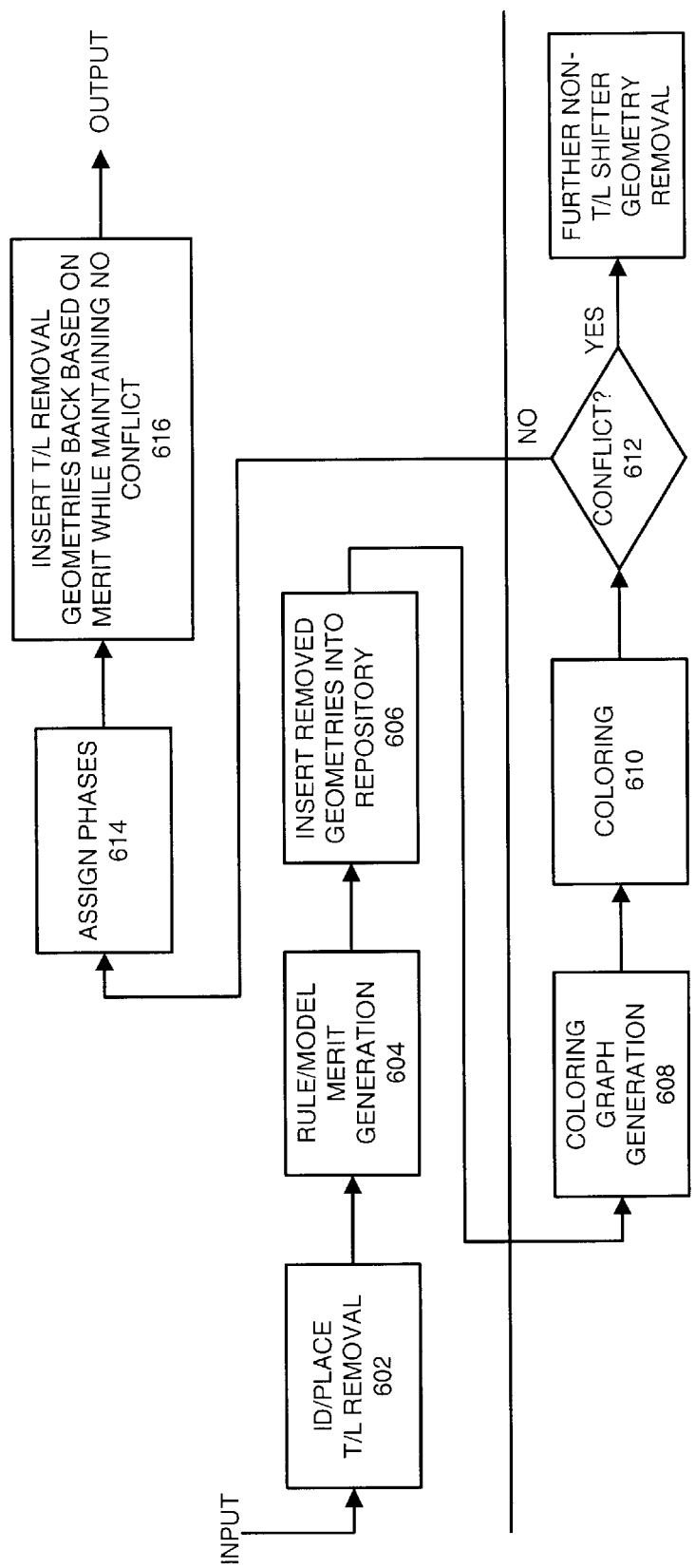
FIG. 6 illustrates a first variation on the flow architecture illustrated in FIG. 5 in accordance with an embodiment of the invention.

FIG. 6 illustrates a first variation on the flow architecture of FIG. 5 in accordance with an embodiment of the invention. In this variation, geometries surrounding T-junctions and L-junctions are removed first. The system subsequently attempts to re-insert these geometries without creating a phase conflict.

More specifically, upon receiving a layout, the system illustrated in FIG. 6 identifies critical features and places phase shifters to define the critical features. The system also removes phase shifter geometries associated with T-junctions and L-junctions (step 602). Next, the system generates merit values for relationships between phase shifters as is described below with reference to FIG. 8 (step 604). These merit values can be determined through a rule-based mechanism, or alternatively through a model-based mechanism that performs a simulation. The system also inserts the removed geometries into a repository for later use (step 606). The system then generates a coloring graph (step 608), and attempts to color the graph (step 610). During this process, the system attempts to detect a conflict (step 612).

If a conflict is detected, the system removes additional geometries associated with T-junctions and L-junctions as is described below with reference to FIG. 7 (step 713). If no further geometries associated with T-junctions and L-junctions can be removed, a more general (non-T/L-junction) shifter geometry removal mechanism is required to resolve the conflicts.

Otherwise, if no conflict is detected, the system assigns phases to the phase shifting geometries (step 614). Next, the system re-inserts phase shifting geometries back into the phase shifting mask if it is possible to do so without creating a coloring conflict (step 616). This generates a final output. Note that geometries can be selected for insertion based upon merit values determined in step 604.

Figure 7:
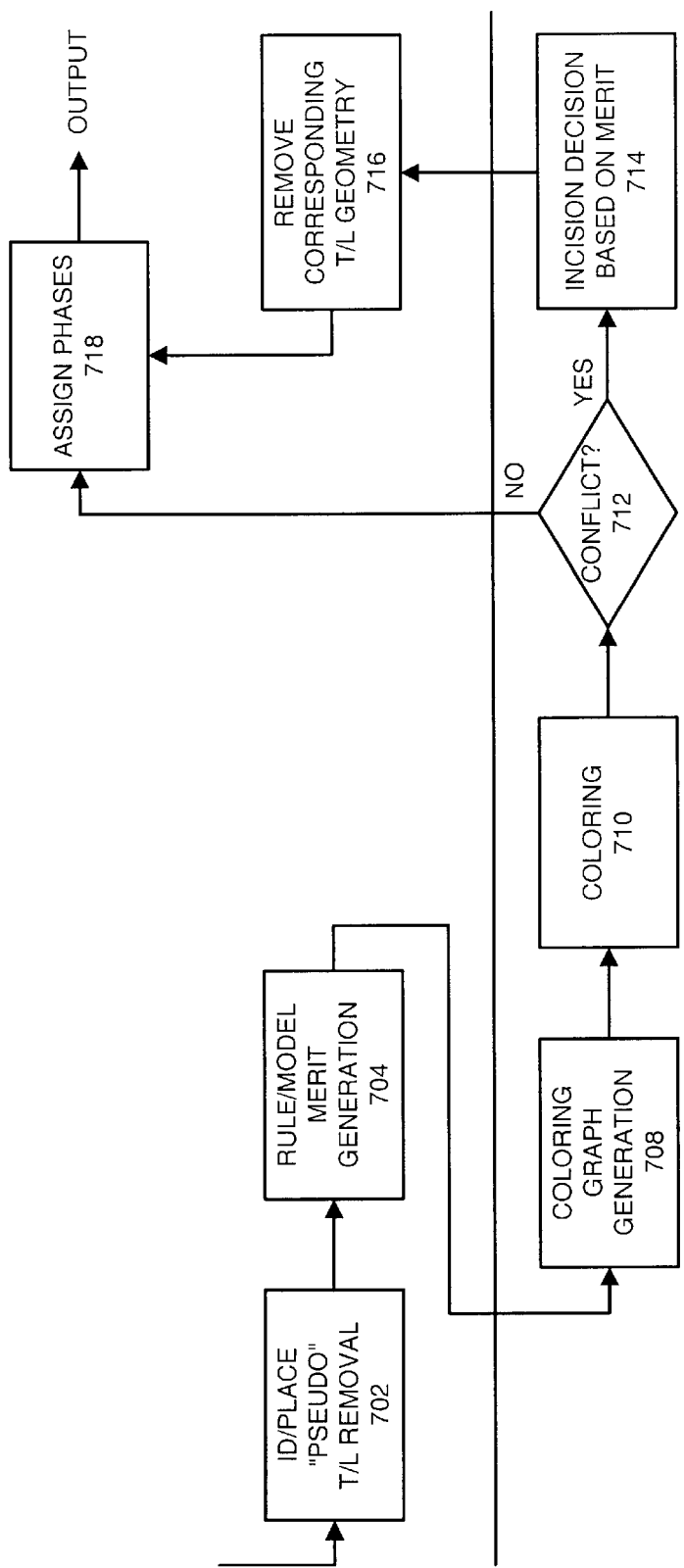
FIG. 7 illustrates a second variation on the flow architecture illustrated in FIG. 5 in accordance with an embodiment of the invention.

FIG. 7 illustrates a second variation on the flow architecture of FIG. 5. In this variation, the system removes geometries surrounding T-junctions and L-junctions as necessary to obviate coloring conflicts.

More specifically, upon receiving a layout, the system identifies critical features and places phase shifters to define the critical features. The system also performs a "pseudo-removal" of phase shifter geometries associated with T-junctions and L-junctions (step 702). This pseudo-removal identifies the geometries that can be removed, but does not actually remove them.

Next, the system generates merit values for relationships between phase shifters as is described below with reference to FIG. 8 (step 704). The system also generates a coloring graph (step 708), and attempts to color the graph (step 710). During this process, the system attempts to detect a conflict (step 712).

If a conflict is detected, the system determines an incision to make based on the merit values calculated in step 704 in order to obviate the coloring conflict (step 714). The system then removes corresponding phase shifter geometries surrounding T-junctions and L-junctions (step 716) before assigning phases to the phase shifting geometries (step 718).

Otherwise, if not conflict is detected, the system assigns phases to the phase shifting geometries to generate a final output (step 718).

Phase Shift Merit Values

Figure 8:
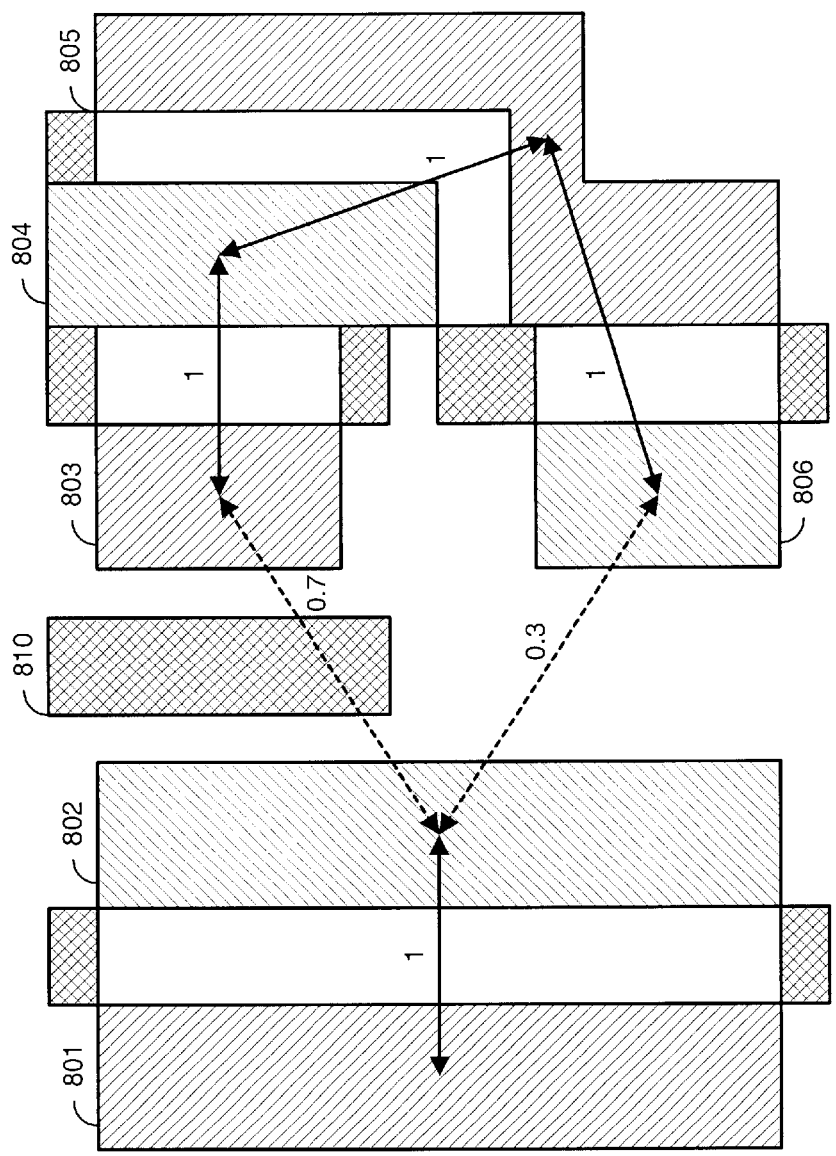
FIG. 8 illustrates phase shift merit values in accordance with an embodiment of the invention.

FIG. 8 illustrates phase shift merit values in accordance with an embodiment of the invention. In the exemplary layout that appears in FIG. 8 there are six different phase-shifting regions 801–806. Pairs of phase shifters located on opposite sides of transistor gates (801,802), (803,804), (804, 805) and (805,806) must be colored differently, so they are assigned the maximum merit value of one. This is sometimes referred to as a "hard" coloring requirement.

Other phase shifter pairs are assigned lower merit values. For example, phase shifters 802 and 806 are in relatively close proximity to each other, so it is desirable but not necessary for them to have different phases. In this case, a merit value of 0.3 is assigned between them. On the other hand, phase shifters 802 and 803 are in close proximity to each other and there exists a polysilicon geometry 810 between them. In this case, it is more desirable for phase shifters 802 and 803 to have different geometries, so a larger merit value of 0.7 is assigned between them.

Note that when subsequent a coloring operation takes place, the coloring operation first seeks to satisfy coloring constraints for larger merit values before satisfying coloring constraints for smaller merit values. In some embodiments, an error results and/or the process is stopped if the hard coloring requirements cannot be met.

The above mentioned phase-shift merit generation (or merit function) depends on a set of pre-specified rules involving the type of features to be phase shifted, the type of features within certain proximity range of shifters, and so on. This is what we refer to as a "rule-based merit generation approach." The merit function can also be constructed based upon lithography process simulation results. For example, besides the "hard" coloring requirements, we can simulate all potential shifter pairs with and without opposite phases assigned and use the percentage of critical dimension (CD) variation of the intended feature to be the merit function. By doing so, the shifters associated with features less sensitive to phase-shifting are more likely to be removed to resolve phase-conflicts. This approach is just one example of what we refer to as model-based (or simulation-based) merit generation.

Junction Types

Figure 9:
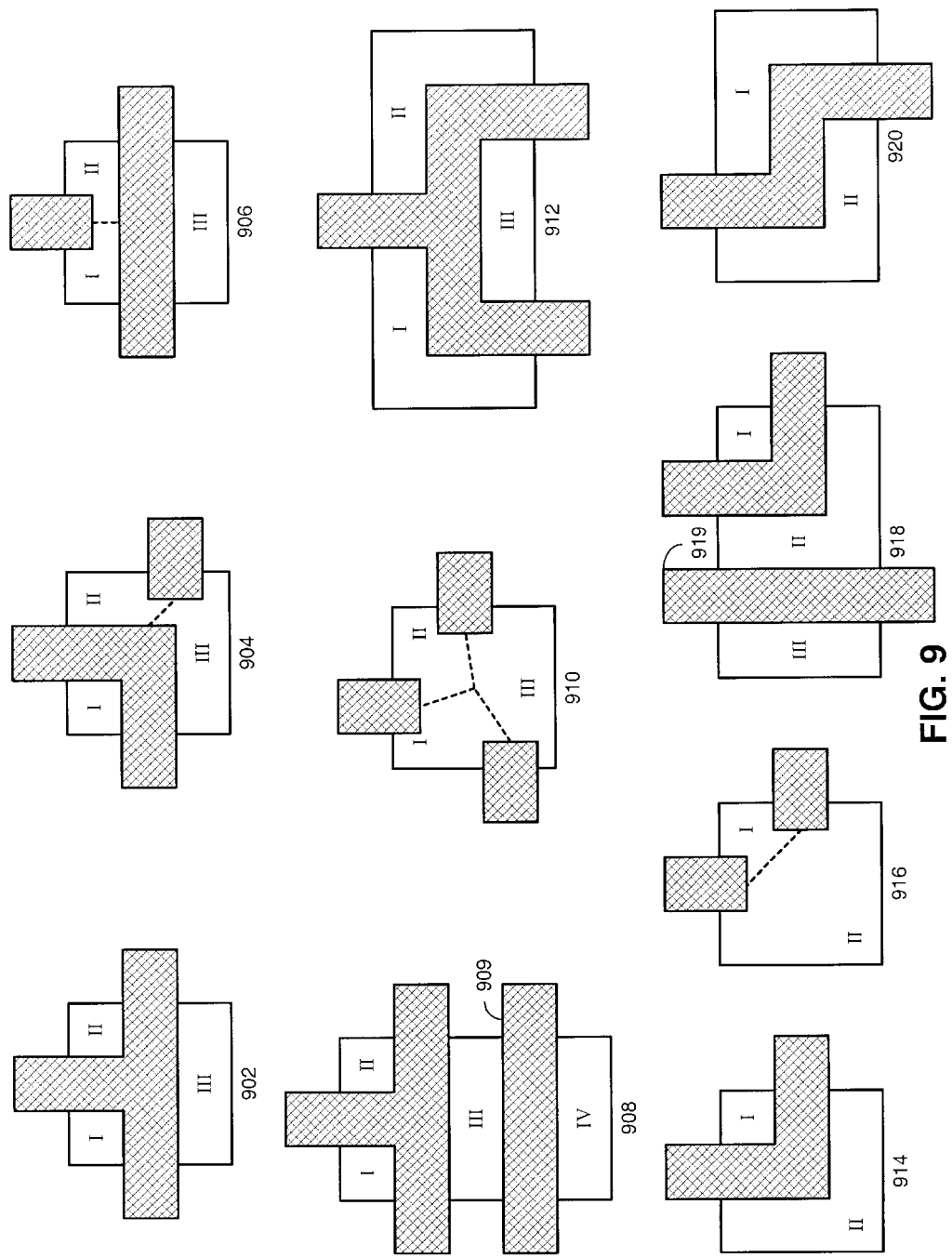
FIG. 9 illustrates various T-junctions and L-junctions in accordance with an embodiment of the invention.

FIG. 9 illustrates various T-junctions and L-junctions in accordance with an embodiment of the invention.

Example 902 presents a T-junction with three different regions I, II and III that can be removed, or cut away, to satisfy obviate coloring conflicts. Examples 904, 906, 910 and 912 are similar in form to the T-junction illustrated in example 902, so they are treated in the same way with corresponding regions I, II and III that can be cut away. Note that regions I, II and III correspond to regions 412, 413 and 414, respectively, in FIG. 4C.

Example 908 is a T-junction in close proximity to a polysilicon line 909. In this example, if region III is removed, a corresponding region IV must be removed on the other side of polysilicon line 909 in order to prevent a coloring conflict.

Example 914 presents an L-junction with two different regions I and II that can be cut away to obviate coloring conflicts. Note that regions I and II correspond to regions 416 and 415, respectively, in FIG. 4D.

Examples 916 and 920 are similar to the L-junction illustrated in example 914, so they are treated in the same way with corresponding regions I and II that can be cut away.

Example 918 is an L-junction in close proximity to a polysilicon line 909. In this example, if region II is removed, a corresponding region III must be removed on the other side of polysilicon line 919 in order to prevent a coloring conflict.

Other embodiments of the invention may detect additional variant forms of T-junctions and L-junctions. In the case of examples with discontiguous polysilicon, e.g. example 908, example 910, etc., one or more ranges may be specified within which the adjoining polysilicon, e.g. the polysilicon 909 relative to the T-junction in example 908, can be found. In one embodiment the range is related to the preferred, minimum, and/or maximum phase shifter width used. For example, if the preferred shifter width is X nm, then polysilicon within X nm+some additional tolerance, might be considered. In some embodiments, the discontiguous examples are referred to as extended T-junctions or extended L-junctions.

Additional Example of Rule-Based Phase-Shift Merit Generation

Figure 10:
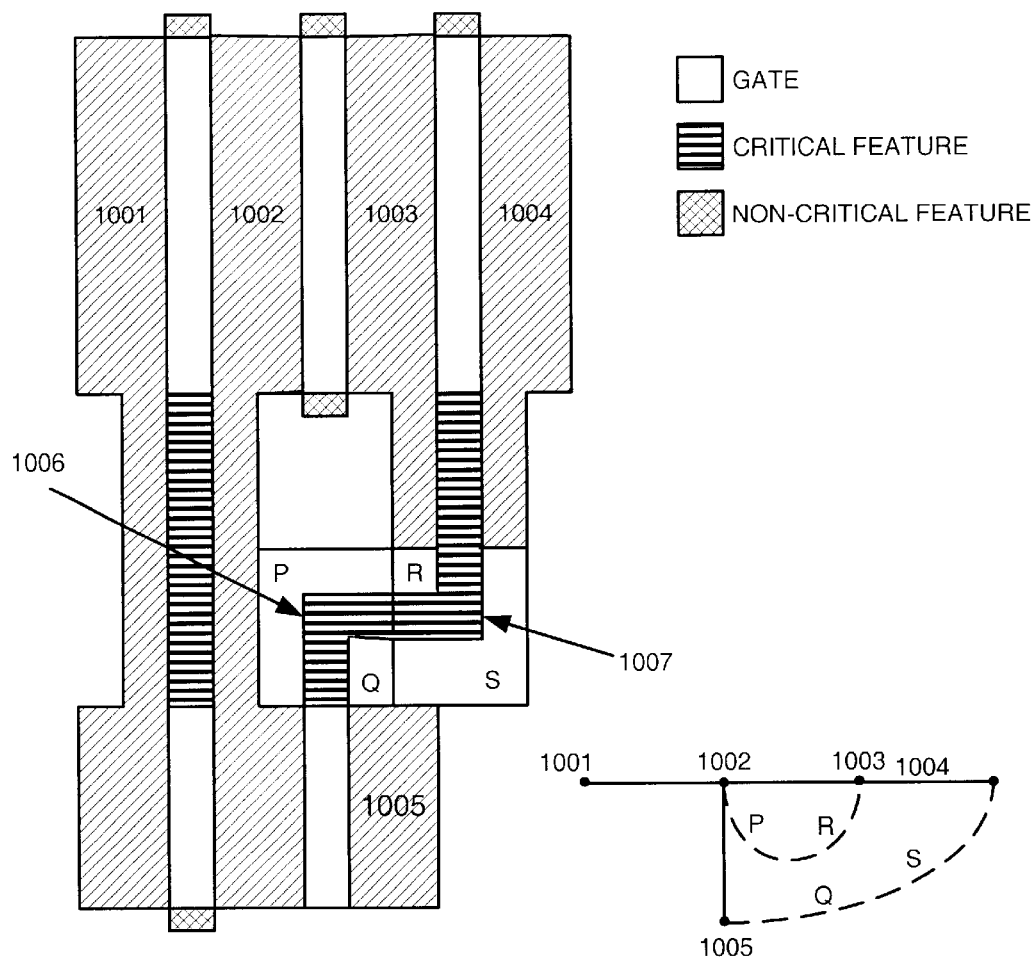
FIG. 10 illustrates an additional example of rule-based phase-shift merit generation in accordance with an embodiment of the invention.

FIG. 10 illustrates an additional example of rule-based phase-shift merit generation in accordance with an embodiment of the invention. In the layout depicted in FIG. 10, there are five gates and two critical interconnects to be phase-shifted. The shifters are denoted by 1001–1005. There are also two L-junctions 1006–1007 with their corresponding shifter geometries P-Q and R-S. The corresponding coloring graph is shown on the lower right, where solid lines represent opposite-phase assignments and the dashed lines represent same-phase assignments. It is evident that we have two phase-conflict loops: the 1002–1003 loop and the 1002–1003–1004–1005 loop.

Note that in FIG. 10, the two L-junctions 1006 and 1007 are blocked. If we use the approach illustrated in PIG. 5 and remove all phase shifting geometries P, Q, R and S, we have no conflict coloring shifters 1001–1005. We can then color phase shifters 1001–1005, and re-insert geometries P and Q associated with junction 1006.

Assuming that we use the distance of a certain junction from gates as our phase-shift merit, that is, the closer this junction is to any gate, the more merit we have by keeping the shifter associated with it. Then, using the approach illustrated in FIG. 6, we remove shifter pieces R and S associated with junction 1007 to resolve both conflicts.

The foregoing description is presented to enable one to make and use the invention, and is provided in the context of a particular application and its requirements. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the present invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

The foregoing descriptions of embodiments of the invention have been presented for purposes of illustration and description only. They are not intended to be exhaustive or to limit the invention to the forms disclosed. Accordingly, many modifications and variations will be apparent. Additionally, the above disclosure is not intended to limit the invention. The scope of the invention is defined by the appended claims.

What is claimed is:

1. A method for automatically resolving conflicts between phase shifters during creation of a phase shifting mask to be used in an optical lithography process for manufacturing an integrated circuit, comprising:

receiving a specification of a layout of the integrated circuit;

identifying critical-dimension features within the layout;

placing phase shifters comprised of phase shifting geometries on the phase shifting mask to precisely define the critical-dimension features;

identifying junctions within and between the critical-dimension features; and removing phase shifting geometries associated with the junctions to obviate coloring conflicts between phase shifters on the phase shifting mask.

2. The method of claim 1, wherein the junctions include one or more of a T-junction and an L-junction.

3. The method of claim 1, wherein the junctions include one or more of an extended T-junction and an extended L-junction.

4. The method of claim 1, further comprising assigning merit values between phase shifting geometries that potentially conflict;
   wherein removing phase shifting geometries involves using the merit values to decide which phase shifting geometries to remove.

5. The method of claim 4, wherein assigning the merit values involves using a rule-based mechanism to assign merit values.

6. The method of claim 4, wherein assigning the merit values involves using a model-based mechanism to assign merit values.

7. The method of claim 1, wherein removing phase shifting geometries involves:
   performing a coloring operation on the phase shifting geometries; and
   if one or more coloring conflicts are detected during the coloring operation, removing phase shifting geometries associated with the junctions to obviate the coloring conflicts.

8. The method of claim 1, wherein removing phase shifting geometries involves:
   removing phase shifting geometries associated with junctions that can potentially give rise to coloring conflicts;
   performing a coloring operation on the remaining phase shifting geometries; and
   inserting removed phase shifting geometries back into the phase shifting mask, if it is possible to do so without creating a coloring conflict.

9. The method of claim 1, wherein removing phase shifting geometries involves:
   removing phase shifting geometries associated with junctions;
   performing a coloring operation on the remaining phase shifting geometries.

10. The method of claim 1, further comprising assigning phases to the phase shifting geometries.

11. The method of claim 1, wherein the critical-dimension features include:
   transistor gates; and
   critical interconnects.

12. A computer-readable storage medium storing instructions that when executed by a computer cause the computer to perform a method for automatically resolving conflicts between phase shifters during creation of a phase shifting mask to be used in an optical lithography process for manufacturing an integrated circuit, the method comprising:
   receiving a specification of a layout of the integrated circuit;
   identifying critical-dimension features within the layout;
   placing phase shifters comprised of phase shifting geometries on the phase shifting mask to precisely define the critical-dimension features;
   identifying junctions within and between the critical-dimension features; and
   removing phase shifting geometries associated with the junctions to obviate coloring conflicts between phase shifters on the phase shifting mask.

13. The computer-readable storage medium of claim 12, wherein the junctions include one or more of a T-junction and an L-junction.

14. The computer-readable storage medium of claim 12, wherein the junctions include one or more of an extended T-junction and an extended L-junction.

15. The computer-readable storage medium of claim 12, wherein the method further comprises assigning merit values between phase shifting geometries that potentially conflict;
   wherein removing phase shifting geometries involves using the merit values to decide which phase shifting geometries to remove.

16. The computer-readable storage medium of claim 15, wherein assigning the merit values involves using a rule-based mechanism to assign merit values.

17. The computer-readable storage medium of claim 15, wherein assigning the merit values involves using a model-based mechanism to assign merit values.

18. The computer-readable storage medium of claim 12, wherein removing phase shifting geometries involves:
   performing a coloring operation on the phase shifting geometries; and
   if one or more coloring conflicts are detected during the coloring operation, removing phase shifting geometries associated with the junctions to obviate the coloring conflicts.

19. The computer-readable storage medium of claim 12, wherein removing phase shifting geometries involves:
   removing phase shifting geometries associated with junctions that can potentially give rise to coloring conflicts;
   performing a coloring operation on the remaining phase shifting geometries; and
   inserting removed phase shifting geometries back into the phase shifting mask, if it is possible to do so without creating a coloring conflict.

20. The computer-readable storage medium of claim 12, wherein removing phase shifting geometries involves:
   removing phase shifting geometries associated with junctions;
   performing a coloring operation on the remaining phase shifting geometries.

21. The computer-readable storage medium of claim 12, wherein the method further comprises assigning phases to the phase shifting geometries.

22. The computer-readable storage medium of claim 12, wherein the critical-dimension features include:
   transistor gates; and
   critical interconnects.

23. An apparatus that automatically resolves conflicts between phase shifters during creation of a phase shifting mask to be used in an optical lithography process for manufacturing an integrated circuit, the apparatus comprising:
   an identification mechanism that is configured to identify critical-dimension features within a layout of the integrated circuit;
   a placement mechanism that is configured to place phase shifters comprised of phase shifting geometries on the phase shifting mask to precisely define the critical-dimension features;
   a junction identification mechanism that is configured to identify junctions within and between the critical-dimension features; and
   a removing mechanism that is configured to remove phase shifting geometries associated with the junctions to obviate coloring conflicts between phase shifters on the phase shifting mask.

24. The apparatus of claim 23, wherein the junctions include one or more of a T-junction and an L-junction.

25. The apparatus of claim 23, wherein the junctions include one or more of an extended T-junction and an extended L-junction.

26. The apparatus of claim 23, further comprising a merit assignment mechanism that is configured to assign merit values between phase shifting geometries that potentially conflict;

wherein the removing mechanism is configured to use the merit values to decide which phase shifting geometries to remove.

27. The apparatus of claim 26, wherein the merit assignment mechanism takes a rule-based approach in assigning merit values.

28. The apparatus of claim 26, wherein the merit assignment mechanism takes a model-based approach assigning merit values.

29. The apparatus of claim 23, wherein the removing mechanism is configured to:

perform a coloring operation on the phase shifting geometries; and if one or more coloring conflicts are detected during the coloring operation, to remove phase shifting geometries associated with the junctions to obviate the coloring conflicts.

30. The apparatus of claim 23, wherein the removing mechanism is configured to:

remove phase shifting geometries associated with junctions that can potentially give rise to coloring conflicts;

perform a coloring operation on the remaining phase shifting geometries; and to insert removed phase shifting geometries back into the phase shifting mask, if it is possible to do so without creating a coloring conflict.

31. The apparatus of claim 23, wherein the removing mechanism is configured to:

remove phase shifting geometries associated with junctions; and to perform a coloring operation on the remaining phase shifting geometries.

32. The apparatus of claim 23, further comprising a phase assignment mechanism that is configured to assign phases to the phase shifting geometries.

33. The apparatus of claim 23, wherein the critical-dimension features include:

transistor gates; and critical interconnects.

34. A phase shifting mask to be used in an optical lithography process for manufacturing an integrated circuit, wherein the phase shifting mask is created through a process for resolving conflicts between phase shifters, the process comprising:

receiving a specification of a layout of the integrated circuit;

identifying critical-dimension features within the layout;

placing phase shifters comprised of phase shifting geometries on the phase shifting mask to precisely define the critical-dimension features;

identifying junctions within and between the critical-dimension features; and removing phase shifting geometries associated with the junctions to obviate coloring conflicts between phase shifters on the phase shifting mask.

35. An integrated circuit created through process that resolves conflicts between phase shifters during creation of a phase shifting mask, the process comprising:

receiving a specification of a layout of the integrated circuit;

identifying critical-dimension features within the layout;

placing phase shifters comprised of phase shifting geometries on the phase shifting mask to precisely define the critical-dimension features;

identifying junctions within and between the critical-dimension features; and removing phase shifting geometries associated with the junctions to obviate coloring conflicts between phase shifters on the phase shifting mask.

36. An integrated circuit created through process that resolves conflicts between phase shifters during creation of a phase shifting mask, the integrated circuit comprising:

critical-dimension features created by using phase shifters comprised of phase shifting geometries on a phase shifting mask to define the critical-dimension features;

wherein T-junctions within and between the critical-dimension features have had corresponding phase shifting geometries on the phase shifting mask removed to obviate coloring conflicts, whereby the resulting critical-dimension features are not defined by phase shifters in the vicinity of the T-junctions.

37. The integrated circuit of claim 36, wherein L-junctions within and between the critical-dimension features have had corresponding phase shifting geometries on the phase shifting mask removed to obviate coloring conflicts, whereby the resulting critical-dimension features are not defined by phase shifters in the vicinity of the L-junctions.

38. A means for automatically resolving conflicts between phase shifters during creation of a phase shifting mask to be used in an optical lithography process for manufacturing an integrated circuit, comprising:

an identification means for identifying critical-dimension features within a layout of the integrated circuit;

a placement means for placing phase shifters comprised of phase shifting geometries on the phase shifting mask to precisely define the critical-dimension features;

a junction identification means for identifying junctions within and between the critical-dimension features; and a removing means for removing phase shifting geometries associated with the junctions to obviate coloring conflicts between phase shifters on the phase shifting mask.

39. A method for manufacturing an integrated circuit product, wherein the method automatically resolves conflicts between phase shifters during creation of a phase shifting mask to be used in an optical lithography process for manufacturing an integrated circuit, comprising:

receiving a specification of a layout of the integrated circuit;

identifying critical-dimension features within the layout;

placing phase shifters comprised of phase shifting geometries on the phase shifting mask to precisely define the critical-dimension features;

identifying junctions within and between the critical-dimension features;

removing phase shifting geometries associated with the junctions to obviate coloring conflicts between phase shifters on the phase shifting mask; and manufacturing the integrated circuit through a lithography process that uses the phase shifting mask.

* * * * *